United States Patent [19]

Murase et al.

[11] 4,352,533

[45] Oct. 5, 1982

[54] CONNECTOR DEVICE FOR PRINTED BOARDS

[75] Inventors: Teruo Murase, Tokorozawa; Kyoichiro Kawano; Akiyoshi Oshitani, both of Kawasaki, all of Japan

[73] Assignee: Fujitsu Limited, Kawasaki, Japan

[21] Appl. No.: 199,932

[22] PCT Filed: Oct. 29, 1979

[86] PCT No.: PCT/JP79/00273

§ 371 Date: Jun. 30, 1980

§ 102(e) Date: Jun. 18, 1980

[87] PCT Pub. No.: WO80/01022

PCT Pub. Date: May 15, 1980

[30] Foreign Application Priority Data

Oct. 31, 1978 [JP] Japan ............................... 53-134352

[51] Int. Cl.[3] ............................................... H05K 1/00

[52] U.S. Cl. ............................. 339/17 L; 339/17 LC; 339/75 MP

[58] Field of Search .......... 339/17 L, 17 LC, 17 LM, 339/17 M, 75 M, 75 MP, 205

[56] References Cited

U.S. PATENT DOCUMENTS

| | | | |
|---|---|---|---|
| 3,466,591 | 9/1969 | Ecclesia | 339/17 |
| 4,125,308 | 11/1978 | Schilling | 339/17 LC |
| 4,230,986 | 10/1980 | Deaver et al. | 339/17 M X |
| 4,232,924 | 11/1980 | Kline et al. | 339/17 L |

*Primary Examiner*—Joseph H. McGlynn
*Assistant Examiner*—Frank H. McKenzie, Jr.
*Attorney, Agent, or Firm*—Staas & Halsey

[57] ABSTRACT

A connector device for printed boards, comprising at least one pair of opposed male connectors on the printed boards, each male connector having at least one projecting terminal, at least one female connector which is movably attached to the terminals of one of the male connectors. The electrical connection between the corresponding projecting terminals of the two opposing male connectors being established and broken by the displacement of the female connectors.

18 Claims, 8 Drawing Figures

CONNECTOR DEVICE FOR PRINTED BOARDS

BACKGROUND

The present invention relates to a connector device for printed boards which are, for example, attached to shelf devices in telecommunication apparatuses.

BACKGROUND ART

There are known connector devices for connecting printed boards to a backboard or a backpanel of a shelf device which is usually in the form of a box-shaped frame. In a known connector device, there are provided a series of male or female connectors on one end of a printed board which is to be electrically connected to a backpanel and a series of female or male connectors on a surface of the backpanel that is opposed to the one end of the printed board, so that when the printed board is inserted into the shelf device toward the backpanel thereof, the connectors of the printed board can be engaged by and connected to the corresponding female or male connectors of the backpanel in a so-called "plug-in" way.

The packaging density of printed boards has been increasing, resulting in an increase in the number of input and output signals and accordingly in an increase in the number of pins or terminals of a connector. As a result, the increased number of connector pins or connector terminals cannot be arranged on one end of the printed board. In order to solve this problem, there has been proposed a printed board which is provided, on its opposite ends, with a series of male or female connectors. The provision of such a printed board is followed by the provision of a pair of printed boards which are identical to the backpanel and which are called mother boards located opposite to the opposite ends of the first mentioned printed board, usually called a card or a daughter board.

However, in a conventional known connector device for establishing the electrical connection between a mother board and a card, the connecting and disconnecting operations are relatively difficult and cannot be easily effected.

SUMMARY OF THE INVENTION

The primary object of the present invention is to provide a connector device for a pair of printed boards, which can easily and reliably effect the connection and disconnection therebetween.

According to the present invention, a card having on its opposite ends connectors, can be easily connected to a pair of spaced stationary mother boards each having connectors corresponding to the connectors of the card.

Further properties of the present invention will become apparent from the detailed description which follows.

BRIEF DESCRIPTION OF THE DRAWINGS

Embodiments of the present invention are illustrated in the accompanying drawings which are incorporated in and constitute a part of this specification and, together with the description, serve to explain the principles of the invention.

DESCRIPTION OF THE PREFERRED EMBODIMENTS

Figure 1:
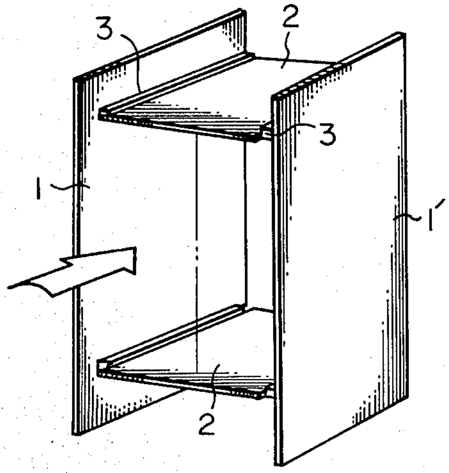
FIG. 1 is a perspective view of mother boards and cards connected thereto by means of a connector device according to the present invention.

First, with reference to FIG. 1, a plurality of printed boards 2 which are called "cards" (only two cards are illustrated) are inserted between a pair of opposed printed boards 1 and 1' which are called "mother boards", along the direction designated by the arrow. The horizontal cards 2 are inserted in a multi-layered fashion between the vertical mother boards 1 and 1'. Each card 2 can be electrically connected at its opposite ends to the corresponding mother boards 1 and 1', by means of connector devices 3 in a so-called "plug-in" fashion.

Figure 2:
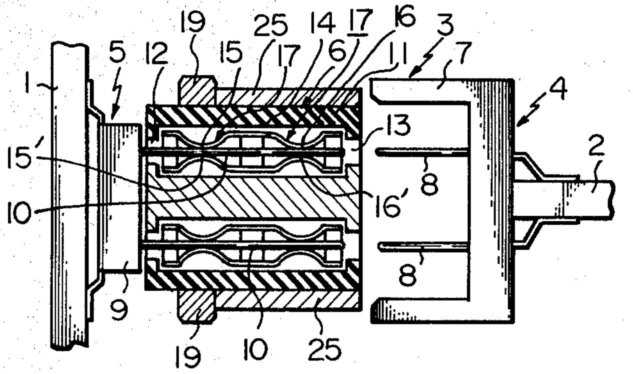
FIG. 2 is a cross-sectional view of a connector device according to the present invention.
Figure 3:
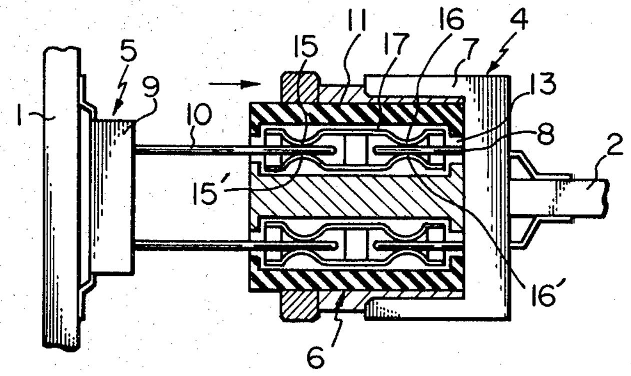
FIG. 3 is a view similar to FIG. 2, but illustrates a different position of the female connector.

Details of the connector devices 3 are illustrated in FIGS. 2 and 3. Each card 2 has at its opposed ends (only one end thereof is illustrated in FIGS. 2 and 3) a series of male connectors 4 along the edges of the ends of the card. Each male connector 4 includes an insulation cover 7 which has at least one termnal 8. Four terminals 8 (only two are illustrated) are provided for each male connector 4 in the illustrated embodiment and project outwardly. Each mother board 1(1') also has on its inner face a series of male connectors 5, so that the latter correspond to the male connectors 4 of the card 2. Each male connector 5 includes an insulation body 9 which has projecting terminals 10, the number of which is equal to that of the corresponding terminals 8. The horizontally extending terminals 8 of the male connectors 4 are in alignment with the horizontally extending corresponding terminals 10 of the male connectors 5. The terminals 10 are longer than the terminals 8. The terminals 8 and 10 are electrically connected to the cards 2 and the mother boards 1 and 1', respectively.

A female connector 6 is provided between each male connector 5 and 4, and is displaceably attached to one of the male connectors 5 and 4, for example, the male connector 5. Each female connector 6 comprises a housing 11 which includes bores 14 with insertion openings 12 and 13 which correspond to the terminals 10 and 8, respectively. In each bore 14 there are housed two spring contact means 17, each consisting of two spring contact elements 15 and 15' or 16 and 16'. The female connectors 6 can be electrically connected to and movably supported by the corresponding male connectors 5, by inserting the terminals 10 in a plug-in fashion into the corresponding insertion openings 12 and between the opposed contact elements 15, 15' and 16, 16'. The terminals 10 can always be connected to the contact elements 15 and 15' even in the operational position of the female connectors 6 as illustrated in FIG. 3.

When the female connector 6 is in a non-operational position, as illustrated in FIG. 2, and is located close to and in contact with the male connector 5, the male connector 4 is spaced from and not in contact with the female connector 6 and accordingly is free from the latter. In this state, card 2 can be inserted and located between the opposed male connectors 4 and 5 without any interruption of the female connectors.

When the card 2 is moved to a predetermined position between the mother boards 1 and 1', the female connector 6 is then displaced from the non-operational position, illustrated in FIG. 2, to the operational position, as in FIG. 3, thus establishing an electrical connection between the mother boards and the card. When the female connector 6 is moved toward the male connector 4 of the card 2, the terminals 8 come into the corresponding insertion openings 13 prior to the separation of the terminals 10 from the contact elements 16 and 16', thus preventing tilt of the female connector during the displacement of the latter. When the housing 11 of the female connector 6 is fitted into the insulation cover 7 of the male connector 4, the terminals 8 are located between the contact elements 16 and 16', as illustrated in FIG. 3. Therefore, electrical connection can be established between the card and the mother boards 1, 1' by means of the male connector 4, the female connector 6 and the male connector 5 in a plug-in fashion.

When the female connector 6 is displaced toward the male connector 5 from the position illustrated in FIG. 3, the contact elements 16 and 16' are separated from the terminals 8, so that the female connector 6 is brought again into the non-operational position of FIG. 2 and the connection between the card 2 and the mother boards 1 (1') is broken.

The movement of the female connectors 6 located between the mother board 1 and the card 2 is reverse to that of the female connectors located between the mother board 1' and the card 2.

Note that, in order to achieve the object of the invention, only a single male connector 4, a single male connector 5 and a single female connector 6 are required at each mother board.

Figure 4:
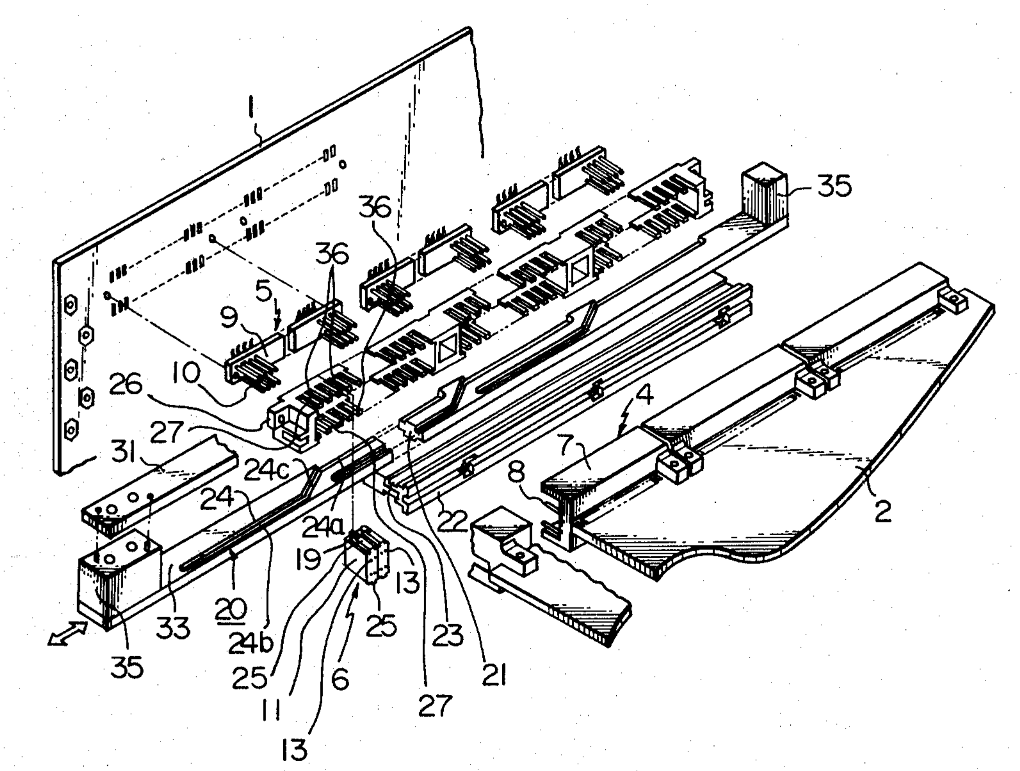
FIG. 4 is an exploded perspective view of a connector device comprising sliding means, according to the present invention.

In practice, a large number of male connectors 4 and 5 are usually provided on the card 2 and the mother boards 1, 1', respectively. FIG. 4, illustrating this construction, shows sliding means 20 which causes the female connectors 6 to be displaced in a direction perpendicular to the direction of the slide movement of the sliding means 20.

The sliding means 20 includes a pair of elongated plates 31 and 33 which are spaced from one another and rigidly interconnected by means of end spacers 35. The plates 31 and 33 are opposed to one another in such a way that they have a mirror image relationship. The plates 31 and 33 extend parallel to the series of male connectors 4 and 5.

The plates 31 and 33 are provided on their outer faces with elongated center projections 21 (FIG. 4 shows the projection for plate 33) which extend the length of the plates 31 and 33. Guide grooves 24 are located on the inner faces of plates 31 and 33. The projections 21 of plates 31 and 33 are fitted into elongated guide channels 23 of guide blocks 22. The guide blocks located above and below plates 31 and 33 and allow the sliding means 20 to slide along the upper and lower guide blocks 22 only in the longitudinal direction of the sliding means 20. In order to slide the sliding means 20, it is not always necessary to provide the upper and the lower guide blocks 22, only one of the guide blocks need be provided. The guide blocks 22 can be secured to and supported by a frame device (not illustrated).

A series of female connectors 6 are located between the two plates 31 and 33. Each has a pair of upper and lower projections or pins 19 which are engaged or fitted in the guide grooves 24 of the upper and lower plates 31 and 33. Each female connector 6 also has upper and lower projections 25 which are fitted into a support block 26 which is located between the plates 31 and 33 and which can be secured to the frame device (not illustrated). The support block 26 has a series of upper and lower comb-like teeth 36 which define a series of guide grooves 27 into which the upper and lower projections 25 of female connectors 6 are slidably fitted. That is, due to the engagement of the projections 25 with the guide grooves 27 which extend perpendicularly to the length of the sliding means 20, the female connectors 6 can move only in a direction perpendicular to the direction of the slide movement of the sliding means 20.

Each guide groove 24 consists of two branch grooves 24*a* and 24*b* which extend parallel to the length of the plate 31 and 33, and an inclined branch groove 24*c* which is located between and connected to the branch grooves 24*a* and 24*b*. Due to the presence of the inclined grooves 24*c* in which the projections 19 of the female connectors 6 are fitted, the slide movement of the sliding means 20 in the directions designated by the arrow in FIG. 4 causes the female connectors 6 to move in a direction perpendicular to the first mentioned direction.

Preferably, the female connectors 6 are divided into a plurality of groups, for example, three groups, each having a plurality of female connectors 6. This division into groups decreases the force required to slide the sliding means 20, i.e. the force required to move the female connectors 6 perpendicular to the movement of the sliding means 20. The male connectors 4 and 5 and the support block 26 are divided into groups that correspond to the female connector groups. The plates 31 and 33 have three sets of guide grooves 24*a*, 24*b*, 24*c*, with each set corresponding to one group of female to each connectors 6. In the embodiment illustrated in FIGS. 5A to 5C, each group of female connectors 6 includes eight female connectors.

Figure 5A:
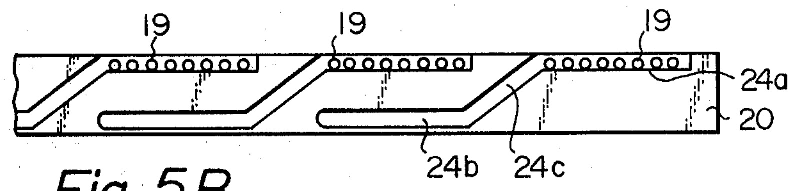
FIGS. 5A to 5C are schematic plan views of a part of sliding means in different positions, and, FIG. 6 is a perspective view of a variant of the female connector illustrated in FIG. 4.
Figure 5B:
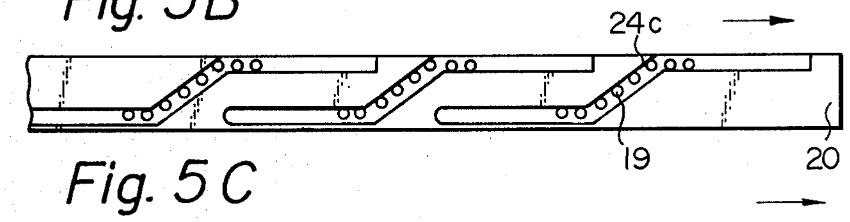

When the female connectors 6 are in a non-operational position as illustrated in FIG. 2, the projections 19 of the female connectors 6 are all located in the branch grooves 24*a*, as illustrated in FIG. 5A. As the sliding means 20 is moved on the guide channels 23 in a direction designated by the arrow in FIG. 5B, the female connectors 6 are displaced in a direction perpendicular to the direction of the movement of the sliding means to establish an electrical connection between the card 2 and the mother board 1 or 1'. During the movement of the sliding means 20, the projections 19 which are positioned in the grooves 24*a* successively come into the inclined grooves 24*c*, as illustrated in FIG. 5B. Further movement of the sliding means 20 causes the projections 19 to be brought into the operational position illustrated in FIG. 5C, in which the projections 19 are positioned in the grooves 24*b*. When the projections 19 are in the position illustrated in FIG. 5C, that is, when the female connectors 6 are in the position illustrated in FIG. 3, the card 2 is electrically connected to the mother board 1 and/or 1'.

Figure 5C:
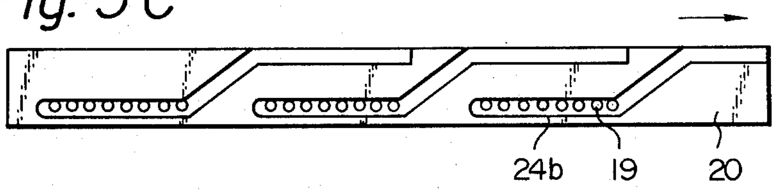

When the sliding means 20 is moved from the position illustrated in FIG. 5C to the position illustrated in FIG. 5A, the female connectors 6 are moved from the position illustrated in FIG. 3 to the position illustrated in FIG. 2. This allows card 2 to be easily disconnected from the mother board 1 and/or 1'. Since the card 2 is released from the female connectors 6, it can be easily removed from the frame device.

Since the female connectors 6 can be divided into groups, for example, three groups, and since each group of the projections 19 can be individually moved by a corresponding set of grooves 24, the force is applied to the sliding means 20 to displace the female connectors 6 is less than the force required to move all of the female connectors 6 at one time, by means of the provision of a single groove 24.

Figure 6:
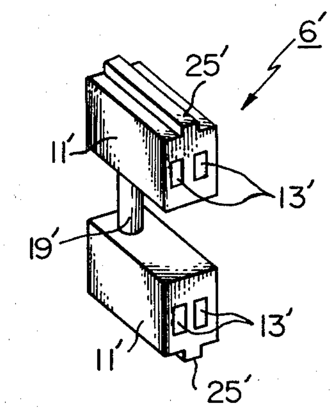

According to a modified embodiment illustrated in FIG. 6, each female connector 6' has a pin 19' extending between separate housings 11', instead of the projections 19 shown in FIGS. 2, 3 and 4. Projections 25' and the insertion openings 13' of FIG. 6 correspond to the projections 25 and the insertion openings 13 illustrated in FIGS. 2, 3 and 4. In the embodiment of FIG. 6, sliding means 20 consists of a single plate 31 or 33 located between the separate housings 11' of the female connectors 6'. The pin 19' extends through the groove 24 of the sliding means 20. Therefore, in the modified embodiment, the grooves 24 which are provided on the sliding means 20 extend through the thickness of the single plate 31 or 33. This requirement is not necessary in the embodiment illustrated in FIGS. 1 to 4 and 5A to 5C.

Therefore, according to the present invention, the cards 2 can be easily connected to and disconnected from the mother board 1 and/or 1' by means of a displaceable female connector or connectors 6 in a plug-in fashion, thus allowing cards 2 to be easily inserted between and removed from the mother boards 1 and 1' by moving the female connectors 6 into and out of their operational position. Furthermore, the female connectors 6 are easily displaced by the movement of the sliding means 20 in a direction perpendicular to the direction of the displacement of the female connectors. Even when multi-layered cards 2 are utilized, the movement of the sliding means requires little effort.

The stepped branches of guide groove 24 provide smooth passage for the projection 19, and thus displacement of the female connectors is easily and smoothly accomplished.

Finally, since the housing 11 of the female connectors 6 is fitted into the grooves 27 of the support block 26, the movement of the female connectors is limited by the latter, thus preventing the female connectors from coming out from the grooves 27.

What is claimed is:

1. A connector device for a plurality of printed boards which are to be electrically interconnected and which are to be spaced from one another, comprising at least one pair of opposed male connectors provided on said printed boards to be interconnected, each male connector being provided with at least one projecting terminal; at least one projecting terminal of one of said opposed male connectors being spaced from and in alignment with said corresponding projecting terminal of the other of said opposed male connectors; and at least one female connector positioned between said opposed male connectors and movably attached to and supported by said at least one projecting terminal of one of said opposed male connectors, the electrical connection between said corresponding projecting terminals of said opposed male connectors being established and broken by the displacement of said at least one interpositioned female connector.

2. A connector device according to claim 1, wherein said female connector comprises spring contact means therein, said spring contact means having at least a pair of opposed spring contact elements for holding and electrically connecting said projecting terminals of said opposed male connectors therebetween.

3. A connector device for a plurality of spaced printed boards which are to be electrically interconnected, the device comprising:

a series of male connectors electrically and mechanically connected to and aligned in a line on said boards, said male connectors of one of said printed boards being opposed to and extending parallel to said male connectors of said other printed board to be interconnected; each male connector having one or more projecting terminals, said projecting terminals of said male connectors of one of said printed boards being spaced from and in alignment with the corresponding projecting terminals of the opposing male connectors of the other printed board; a series of intermediate female connectors positioned between the parallel series of opposed male connectors and movably attached to and supported by said corresponding projecting terminals of said male connectors of one of said printed boards; and means for displacing said female connectors in a direction parallel to said projecting terminals for establishing and breaking the electrical connection between the parallel series of opposed male connectors.

4. A connector device of claim 3, wherein said female connector further comprises spring contact means having a pair of opposing spring contact elements for holding and electrically connecting said projecting terminals of said printed boards therebetween; and means fixedly connected to said female connectors for engaging said displacing means.

5. A connector device of claim 3, wherein said means for displacing said female connectors comprises sliding means, slidable in a direction perpendicular to the direction of the displacement of said female connectors and engagable with said female connectors for providing displacement of said series of female connectors, wherein the electrical connection between the corresponding projecting terminals of said opposing series of male connectors is established and broken by the displacement of said intermediate series of female connectors due to the sliding movement of said sliding means.

6. A connector device of claim 5, wherein said sliding means comprises a single rigid plate having a set of parallel inclined slots and a set of slots parallel to the direction of sliding connected to said inclined slots wherein said slots extend through the thickness of said plate and wherein said female connectors have portions slidably engaged in said slots.

7. A connector device of claim 6, wherein each said female connector comprises a pair of separated blocks, said blocks having an interconnecting element for rigidly connecting said blocks to one another so that said single plate slidably fits between said pair of blocks and said interconnecting element slidably fits into said slot sets and wherein each block has spring contact means, said spring contact means having a pair of opposing spring contact elements for holding and electrically connecting said projecting terminals of said printed boards therebetween.

8. A connector device according to claim 6, wherein said male connectors of said printed boards and said female connectors are divided into a plurality of groups, each group having a plurality of male connectors and female connectors, wherein said sliding means engages said female connectors so that one of said female connectors in each group can be successively displaced.

9. A connector device according to claim 8, wherein the number of said inclined slots corresponds to the number of said groups of female connectors.

10. A connector device according to claim 5, wherein said sliding means comprises a pair of rigidly interconnected plates between which are located said series of female connectors, each of said plates being provided, on its inner face, with a plurality of inclined grooves for guiding said series of female connectors; each of said female connectors being provided with a pair of projections which are fitted into said inclined grooves, so that the sliding movement of said sliding means causes said female connectors to be displaced.

11. A connector device according to claim 10, wherein each of said plates further comprises a plurality of groove pairs wherein each groove is parallel to the direction of sliding and each has a start and end point wherein said plurality of inclined grooves correspondingly join pairs of said parallel grooves such that said end point of one of said parallel pairs is joined to said start point of the opposite groove of the next pair.

12. A connector device according to claim 10, wherein said male connectors of said printed boards and said female connectors are divided into a plurality of groups, each group having a plurality of male connectors and female connectors, wherein said sliding means engages said female connectors so that one of said female connectors in each group can be successively displaced.

13. A connector device according to claim 10 or 12, wherein said device further comprises means for guiding said sliding means such that said sliding means moves only in the direction of the sliding movement.

14. A connector device according to claim 13, wherein said device further comprises means for guiding the displacement of said female connectors such that said female connectors are displaced in directions perpendicular to the direction of the sliding movement of said sliding means.

15. A connector device according to claim 10 or 12, wherein said device further comprises means for guiding the displacement of said female connectors such that said female connectors are displaced in directions perpendicular to the direction of the sliding movement of said sliding means.

16. A connector device of claim 15, wherein said means for guiding displacement of said female connectors comprises a pair of rigidly interconnected plates, each of said plates being provided with parallel slots extending through the thickness of said plates and wherein the length of each slot is less than the width of said plate, and wherein said female connectors are positioned between said plates and have outside portions slidably fitting into said slots of said pair of plates.

17. A connector device according to claim 12, wherein the number of said inclined grooves corresponds to the number of said groups of female connectors.

18. A system comprising a connector device of claim 1 or 3, wherein said plurality of printed circuit boards to be interconnected comprise at least two boards vertically oriented perpendicularly with respect to the remainder of said plurality of printed circuit boards, said vertically oriented boards having groups of said male connectors electrically and mechanically connected thereto, and arranged to correspond to groups of said male connectors electrically and mechanically connected to said horizontal plurality of printed circuit boards, and wherein said female connectors are correspondingly and respectively positioned between said vertical printed circuit boards and said plurality of horizontal printed circuit boards so that said horizontal printed circuit boards are electrically and mechanically connected to each of said vertical printed circuit boards.

* * * * *

UNITED STATES PATENT AND TRADEMARK OFFICE

CERTIFICATE OF CORRECTION

PATENT NO. : 4,352,533

DATED : October 5, 1982

INVENTOR(S) : Murase et al.

It is certified that error appears in the above-identified patent and that said Letters Patent is hereby corrected as shown below:

Col. 4, line 37, delete "to" (second occurrence).

line 38, delete "each".

Col. 5, line 6, delete "is".

Signed and Sealed this

*Eighth* Day of *March 1983*

[SEAL]

*Attest:*

GERALD J. MOSSINGHOFF

*Attesting Officer* *Commissioner of Patents and Trademarks*